(12) United States Patent
Kim et al.

(10) Patent No.: US 9,740,039 B2
(45) Date of Patent: Aug. 22, 2017

(54) DISPLAY DEVICE

(71) Applicant: Samsung Display Co., Ltd., Yongin-si (KR)

(72) Inventors: Jin Suek Kim, Daejeon (KR); Gwan-Soo Kim, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/858,061

(22) Filed: Sep. 18, 2015

(65) Prior Publication Data
US 2016/0202546 A1   Jul. 14, 2016

(30) Foreign Application Priority Data
Jan. 12, 2015   (KR) .................. 10-2015-0004344

(51) Int. Cl.
| | |
|---|---|
| *H01L 29/04* | (2006.01) |
| *G02F 1/1335* | (2006.01) |
| *G02B 5/20* | (2006.01) |
| *G02F 1/1368* | (2006.01) |
| *H01L 27/12* | (2006.01) |
| *H01L 27/15* | (2006.01) |

(52) U.S. Cl.
CPC ....... *G02F 1/133514* (2013.01); *G02B 5/201* (2013.01); *G02F 1/1368* (2013.01); *G02F 1/133512* (2013.01); *H01L 27/124* (2013.01); *H01L 27/15* (2013.01); *G02F 2001/133519* (2013.01); *G02F 2201/52* (2013.01)

(58) Field of Classification Search
CPC ..... H01L 27/124; H01L 27/15; H01L 27/775; H01L 27/12; H01L 29/4908; H01L 33/38; H01L 33/20; H01L 27/153; H01L 33/62; H01L 27/156; G02F 1/133514; G02F 1/1368; B02B 5/201
USPC ...... 257/59, 72, 91, 98, 99, 100, 40; 438/48, 438/128, 149, 151, 157, 283
See application file for complete search history.

(56) References Cited

U.S. PATENT DOCUMENTS

| | | | |
|---|---|---|---|
| 8,441,601 B2 * | 5/2013 | Lee .................. | G02F 1/133514 349/108 |
| 2006/0139515 A1 * | 6/2006 | Baek ...................... | G02B 5/201 349/106 |
| 2010/0171910 A1 * | 7/2010 | Liu ......................... | G02B 5/201 349/106 |
| 2012/0032583 A1 * | 2/2012 | Kim ....................... | H01L 27/322 313/504 |
| 2012/0320270 A1 * | 12/2012 | Takata ................... | G02B 6/0073 348/554 |
| 2014/0008115 A1 * | 1/2014 | Sato ...................... | G06F 3/041 174/258 |
| 2014/0118411 A1 | 5/2014 | Jang et al. | |

(Continued)

FOREIGN PATENT DOCUMENTS

| | | |
|---|---|---|
| KR | 1020070037114 | 4/2007 |
| KR | 1020100038617 | 4/2010 |
| KR | 1020100077979 | 7/2010 |

*Primary Examiner* — Thinh T Nguyen
(74) *Attorney, Agent, or Firm* — Cantor Colburn LLP

(57) ABSTRACT

A display device includes a plurality of color filters positioned in a plurality of color pixels, respectively, and representing different colors from each other, and an overcoat layer including a transparent organic material and a blue colorant and including a portion positioned on the plurality of color filters and a portion positioned in the white pixel.

20 Claims, 15 Drawing Sheets

(56) References Cited

U.S. PATENT DOCUMENTS

| | | | |
|---|---|---|---|
| 2015/0241621 A1* | 8/2015 | Inui | G02F 1/133615 349/65 |
| 2016/0104865 A1* | 4/2016 | Jung | H01L 51/0051 257/40 |
| 2016/0197104 A1* | 7/2016 | Kim | H01L 27/1251 257/347 |

* cited by examiner

FIG. 5

| Overcoat layer | | Entire white color coordinate (W-all) | | White pixel white color coordinate (W-W) | | RGB white color coordinate (W-RGB) | |
|---|---|---|---|---|---|---|---|
| | | x | y | x | y | x | y |
| Transparent organic layer (A) | Front side | 0.282 | 0.29 | 0.302 | 0.294 | 0.268 | 0.287 |
| | Lateral Side | 0.304 | 0.309 | 0.33 | 0.332 | 0.28 | 0.292 |
| Transparent organic layer including blue colorant (B) | Front side | 0.28 | 0.288 | 0.293 | 0.286 | 0.268 | 0.286 |
| | Lateral Side | 0.295 | 0.3 | 0.32 | 0.32 | 0.28 | 0.291 |
| Transparent organic layer including red/green colorant (C) | Front side | 0.284 | 0.292 | 0.31 | 0.3 | 0.268 | 0.288 |
| | Lateral Side | 0.31 | 0.32 | 0.34 | 0.35 | 0.28 | 0.292 |

DISPLAY DEVICE

This application claims priority to Korean Patent Application No. 10-2015-0004344 filed on Jan. 12, 2015, and all the benefits accruing therefrom under 35 U.S.C. §119, the entire contents of which are incorporated herein by reference.

BACKGROUND (a) Field

The invention relates to a display device, and more particularly, to a display device including white pixels.

(b) Description of the Related Art

A display device such as a liquid crystal display ("LCD") and an organic light emitting diode display ("OLED") generally includes a display panel including a plurality of pixels including switching elements and a plurality of signal lines, a gray voltage generating unit generating a gray reference voltage, a data driver generating a plurality of gray voltages by using the gray reference voltage and applying a gray voltage corresponding to an input image signal among the generated gray voltages to a data line as a data signal, and the like.

The display device includes a self-emission display device including a light emission element capable of emitting light by itself and a light-receiving display device including a backlight.

As a representative example of the light-receiving display device, the LCD is one of the most common types of display devices currently in use. The LCD includes a display panel including a plurality of pixels and a backlight unit supplying light to the display panel. The display panel includes a liquid crystal layer having dielectric anisotropy and field generating electrodes such as a pixel electrode and a common electrode which generate an electric field in the liquid crystal layer. The pixel electrodes may be arranged in a matrix form and connected to the switching elements such as a thin film transistor ("TFT") to sequentially receive data voltages for each row. The common electrode receives a common voltage. A desired image may be acquired by applying the voltages to the pixel electrode and the common electrode to generate an electric field in the liquid crystal layer and controlling the intensity of the electric field to control transmittance of light passing through the liquid crystal layer.

Two field generating electrodes such as the pixel electrode and the common electrode may be positioned on one display panel or may be provided on two display panels facing each other, respectively. When the display device includes two display panels, the pixel electrodes receiving the data voltage of the field generating electrodes and a plurality of TFTs are arranged in a matrix form on one display panel of two display panels facing each other, and color filters expressing basic colors such as red, green, and blue and a light blocking member which may prevent light leakage between the pixels may be disposed on the other display panel. Unlike this, the light blocking member may also be disposed on the same display panel as the pixel electrode and the TFT, and in this case, the color filters may be formed on the same display panel as the pixel electrode.

Such a light-receiving display device generally includes red pixels, green pixels, and blue pixels which may display images of three primary colors of red, green, and blue, respectively. Various color displays may be implemented by controlling luminance of each of the red pixels, the green pixels, and the blue pixels. However, since the red pixel, the green pixel, and the blue pixel include color filters, an amount of light emitted from the backlight is decreased while passing through the color filters, and as a result, the luminance of the image deteriorates. In order to solve the problem, white pixels which do not include color filters, other than the color pixels expressing the primary colors such as three primary colors, may transmit more light of the backlight than the color pixels having corresponding color filters associated therewith. That is, the white pixel does not include the color filter, and as a result, the luminance of the image may be increased.

SUMMARY

In the case where the display device includes white pixels, generally, a material such as resin for a white filter is deposited on the entire surface of a substrate and then needs to be patterned by a method such as a photolithography process. Accordingly, in the case of adding the white pixels, luminance may be increased, but the photolithography process is added, and as a result, a processing time, processing cost, and the like are increased, and a manufacturing process is complicated.

Therefore, the invention has been made in an effort to provide a display device having advantages of reducing a manufacturing time, manufacturing cost, and the like by simplifying a manufacturing process of a display device including white pixels.

Further, the invention has been made in an effort to provide a display device having advantages of substantially equalizing a white color coordinate represented by a plurality of color pixels such as a red pixel, a green pixel, and a blue pixel and a white color coordinate singly represented by a white pixel.

An exemplary embodiment of the invention provides a display device including a plurality of color filters positioned in a plurality of color pixels, respectively, and representing different colors from each other, and an overcoat layer including a transparent organic material and a blue colorant and including a portion positioned on the plurality of color filters and a portion positioned in the white pixel.

In an exemplary embodiment, the plurality of color filters may include a red filter representing red, a green filter representing green, and a blue filter representing blue, and an amount of the blue colorant included in the overcoat layer positioned in one of the white pixel may be smaller than an amount of a blue colorant included in the blue filter positioned in one of the plurality of color pixels.

In an exemplary embodiment, the display device may further include a first substrate and a second substrate facing each other, and a plurality of signal lines positioned on the first substrate, in which each of the plurality of color pixels and the white pixel may include at least one TFT connected with the plurality of signal lines, and the plurality of color filters and the overcoat layer may be positioned on the second substrate.

In an exemplary embodiment, the display device may further include a light blocking member which is positioned on the second substrate and in which a plurality of openings is defined, the color filter may include a portion positioned in the opening of the light blocking member, and the overcoat layer may include a portion positioned in the white pixel and positioned in the opening of the light blocking member.

In an exemplary embodiment, a thickness of the overcoat layer positioned in the white pixel may be larger than a thickness of the overcoat layer positioned in the plurality of color pixels.

In an exemplary embodiment, a height of an upper surface of the overcoat layer positioned in the white pixel may be smaller than a height of the upper surface of the overcoat layer positioned in the plurality of color pixels.

In an exemplary embodiment, the display device may further include a substrate and a plurality of signal lines positioned on the substrate, in which each of the plurality of color pixels and the white pixel may include at least one TFT connected with the plurality of signal lines, and the plurality of color filters and the overcoat layer may be positioned on the TFT.

According to the exemplary embodiments of the invention, it is possible to reduce a manufacturing time, manufacturing costs, and the like by simplifying a manufacturing process of the display device including white pixels.

Further, it is possible to enhance color quality of displayed images by substantially equalizing a white color coordinate represented by a plurality of color pixels such as a red pixel, a green pixel, and a blue pixel and a white color coordinate singly represented by a white pixel. Further, it is possible to improve side visibility by reducing a color change according to a viewing angle of the display device.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which:

FIG. 5 is a table illustrating a white color coordinate at a front side and a lateral side according to a kind of overcoat layer.

DETAILED DESCRIPTION

Figure 1:
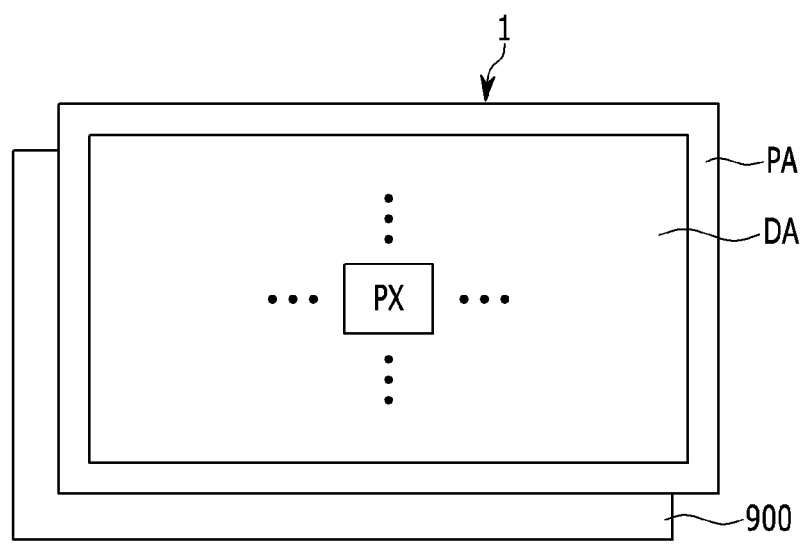
FIG. 1 is a schematic plan view of an exemplary embodiment of a display device according to the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

First, a display device according to an exemplary embodiment of the invention will be described with reference to FIGS. 1, 2A, and 2B.

Figure 2A:
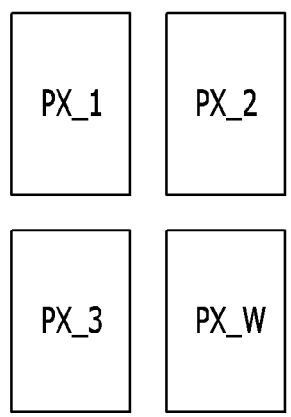
FIGS. 2A and 2B are plan views of the exemplary embodiment of a plurality of pixels included in the display device according to the invention, respectively.
Figure 2B:
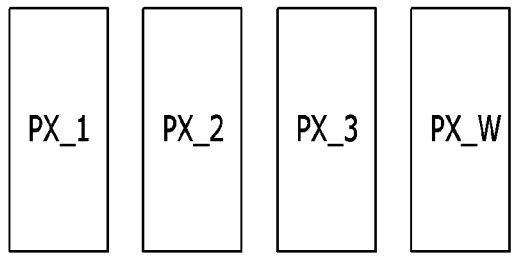

FIG. 1 is a schematic plan view of a display device according to an exemplary embodiment of the invention, and FIGS. 2A and 2B are plan views of a plurality of pixels included in the display device according to the exemplary embodiment of the invention, respectively.

Referring to FIG. 1, the display device according to the exemplary embodiment of the invention may include a display panel 1 and a backlight 900 positioned at the back of the display panel 1.

The display panel 1 may include a display area DA which is an area where an image is displayed and a peripheral area PA positioned therearound. In the display area DA, a plurality of signal lines (not illustrated) and a plurality of pixels PX connected thereto may be included. In an exemplary embodiment, the plurality of pixels PX may be arranged substantially in a matrix form. In the exemplary embodiment, the pixel may refer to a unit area in which an image corresponding to one image signal is displayed, and include a transmitting area (referred to as an aperture area) in which light is actually transmitted or emitted and a light blocking area in which the light is blocked. In the light blocking area, an electric device such as a thin film transistor ("TFT") for applying a signal to the corresponding pixel PX or a light blocking member (not illustrated) may be positioned.

Referring to FIGS. 2A and 2B, the plurality of pixels PX includes a plurality of color pixels PX_1, PX_2, and PX_3 and a white pixel PX_W.

In an exemplary embodiment, the plurality of color pixels PX_1, PX_2, and PX_3 may display one of the primary colors such as three primary colors of red, green and blue or four primary colors. The primary colors are not limited to three primary colors of red, green and blue, and may include various other colors such as cyan, magenta, yellow, and the like. The plurality of color pixels according to the exemplary embodiment of the invention may include a first color pixel PX_1, a second color pixel PX_2, a third color pixel PX_3, and the like. In the exemplary embodiment, an example in which the first color pixel PX_1 is a red pixel displaying red, the second color pixel PX_2 is a green pixel displaying green, and the third color pixel PX_3 is a blue pixel displaying blue will be described.

The plurality of color pixels PX_1, PX_2, and PX_3 displays each of the primary colors and allows a desired color to be recognized by a spatial sum of the primary colors to express a full color.

The white pixel PX_W evenly transmits light having substantially all wavelength ranges of visible light instead of transmitting light having a predetermined wavelength range to display a white image. The white pixel PX_W may serve to improve color reproducibility of the display device or enhance luminance.

When all of the plurality of adjacent color pixels PX_1, PX_2, and PX_3 are turned on to display an image, the white pixel PX_W adjacent to the plurality of color pixels is driven together to enhance luminance of the displayed image. In the case of displaying the white image, only the white pixel PX_W may be driven, only the plurality of color pixels PX_1, PX_2, and PX_3 may be driven, and all pixels PX_1, PX_2, PX_3, and PX_W may be driven.

The layout of the plurality of color pixels PX_1, PX_2, and PX_3 and the white pixel PX_W may be variously determined.

Referring to FIG. 2A, in an exemplary embodiment, the plurality of adjacent color pixels PX_1, PX_2, and PX_3 and the white pixel PX_W may be disposed substantially in a quadrangular matrix form. The first color pixel PX_1 and the white pixel PX_W may be adjacent to each other in a diagonal direction, and the second color pixel PX_2 and the third color pixel PX_3 may be adjacent to each other in a diagonal direction. Further, the first color pixel PX_1 and the third color pixel PX_3 may be adjacent to each other in a column direction, and the second color pixel PX_2 and the white pixel PX_W may be adjacent to each other in a column direction. Further, the first color pixel PX_1 and the second color pixel PX_2 may be adjacent to each other in a row direction, and the third color pixel PX_3 and the white pixel PX_W may be adjacent to each other in a row direction.

Referring to FIG. 2B, in the display device according to the exemplary embodiment of the invention, the plurality of adjacent color pixels PX_1, PX_2, and PX_3 and the white pixel PX_W may be disposed in one row. In an exemplary embodiment, the color pixels such as the first color pixel PX_1, the second color pixel PX_2, and the third color pixel PX_3 and the white pixel PX_W may be sequentially disposed in a row direction. At least one of the sizes and the shapes of the plurality of color pixels PX_1, PX_2, and PX_3 and the white pixel PX_W may be the same as each other, but is not limited thereto.

Such a pixel layout may be constant in the display area DA and may be changed according to a position.

Next, a display device according to another exemplary embodiment of the invention will be described in detail with reference to FIGS. 3 and 4 in addition to the drawings described above.

Figure 3:
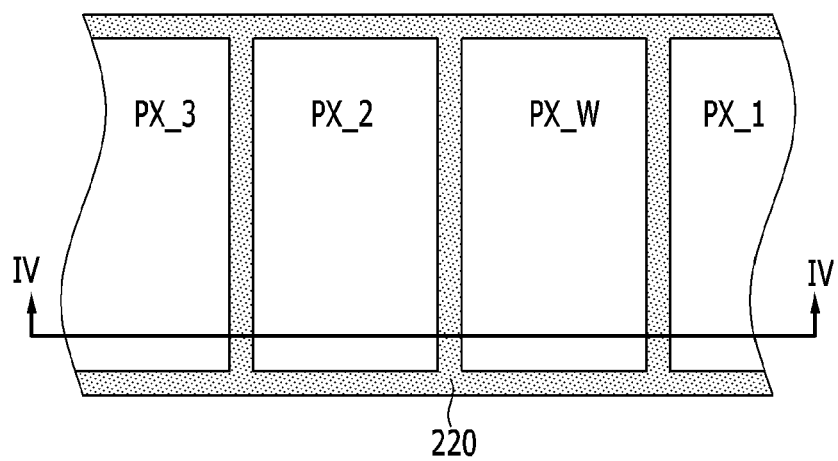
FIG. 3 is a schematic plan view of another exemplary embodiment of a display device according to the invention.
Figure 4:
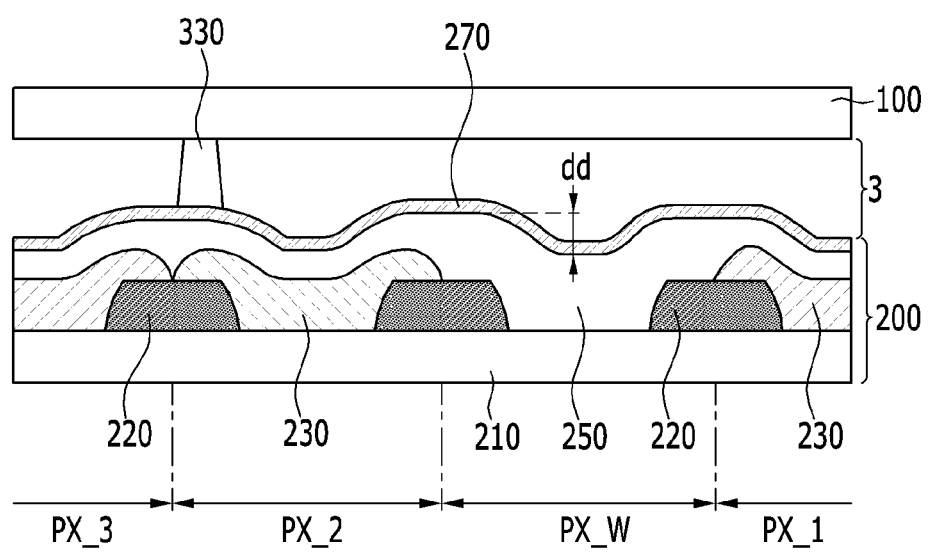
FIG. 4 is a cross-sectional view illustrating the display device illustrated in FIG. 3 taken along line IV-IV.

FIG. 3 is a schematic plan view of a display device according to another exemplary embodiment of the invention, and FIG. 4 is a cross-sectional view illustrating the display device illustrated in FIG. 3 taken along line IV-IV.

A display device according to the exemplary embodiment of the invention, as a liquid crystal display ("LCD"), includes a lower panel 100 and an upper panel 200 facing each other, and a liquid crystal layer 3 interposed therebetween.

The lower panel 100 is not illustrated in detail, but may include a plurality of TFTs and a plurality of signal lines connected therewith. The signal lines may include a gate line transferring a gate signal to the TFT and a data line transferring a data signal to the TFT. The TFT, as a switching element, may be controlled according to the gate signal to transfer a data voltage of the data line.

The upper panel 200 may include a light blocking member 220 and a plurality of color filters 230 which are positioned on a substrate 210 including an insulating material such as glass and plastic when viewed from the cross-sectional structure.

The light blocking member 220 positioned in the display area DA is referred to as a black matrix, and a plurality of openings defining transmitting areas of the pixels PX_1, PX_2, PX_3, and PX_W may be defined in the light blocking member 220. The light blocking members 220 is positioned between the adjacent pixels PX_1, PX_2, PX_3, and PX_W to prevent light leakage. The light blocking member 220 may include a pigment for light blocking such as black carbon and include a photosensitive organic material.

In an exemplary embodiment, the color filter 230 includes a colorant representing a color and may include a binder, a photoinitiator, and an organic material such as a monomer. In an exemplary embodiment, the colorant may be a pigment form. The color filter 230 representing the corresponding color is positioned in one of the color pixels PX_1, PX_2, and PX_3.

In an exemplary embodiment, the color filters 230 may include a red filter, a green filter, and a blue filter which may represent three primary colors such as red, green, and blue, respectively. In an exemplary embodiment, the red filter may include a red colorant, the green filter may include a green colorant, and the blue filter may be a blue colorant. In an exemplary embodiment, a ratio of the red colorant to the entire materials of the red filter, a ratio of the green colorant to the entire materials of the green filter, and a ratio of the blue colorant to the entire materials of the blue filter may be approximately 15 wt % or more, respectively.

However, the colors represented by the color filters 230 are not limited thereto, and the color filters 230 may represent other primary colors, for example, three primary colors of magenta, cyan, and yellow.

An overcoat layer 250 is entirely disposed on the color filter 230 and the substrate 210. That is, the overcoat layer 250 may be positioned on the light blocking member 220 and the color filter 230, and the substrate 210 of the white pixel PX_W.

The transmitting area of the white pixel PX_W may be almost occupied by the overcoat layer 250. Accordingly, the thickness of the overcoat layer 250 positioned in the transmitting area of the white pixel PX_W may be substantially the same as or larger than the thickness of the color filter 230 positioned in the transmitting area of the color pixels PX_1, PX_2, and PX_3. Further, the thickness of the overcoat layer 250 positioned in the transmitting area of the white pixel PX_W may be larger than that of the overcoat layer 250 positioned on the color filters 230 of the color pixels PX_1, PX_2, and PX_3. Accordingly, in the white pixel PX_W, the height of the upper surface of the overcoat layer 250 may be the same as or larger than the height of the upper surface of the color filter 230 positioned in the transmitting area of the color pixels PX_1, PX_2, and PX_3.

The height of the upper surface of the overcoat layer 250 in the transmitting area of the white pixel PX_W may be smaller than a height of the upper surface of the overcoat layer 250 in the transmitting area or the light blocking area of the color pixels PX_1, PX_2, and PX_3, and a difference dd in height may vary according to the viscosity of the overcoat layer 250.

Since the upper surface of the overcoat layer 250 in the white pixel PX_W sags below the upper surface of the overcoat layer 250 in the color pixels PX_1, PX_2, and PX_3, the overcoat layer 250 may include a high flattened organic material having sufficient viscosity so as to prevent a thickness of the liquid crystal layer 3 of the white pixel PX_W, that is, a cell gap from being different from a cell gap of the color pixels PX_1, PX_2, and PX_3.

The overcoat layer 250 includes a transparent organic material, and may control flatness on the substrate 210 by properly controlling the viscosity.

The overcoat layer 250 according to the exemplary embodiment of the invention includes a predetermined amount of the blue colorant. The amount of the blue colorant included in the overcoat layer 250 positioned in one white pixel PX_W is smaller than an amount of the blue colorant included in one blue filter of the blue pixel of the color pixels PX_1, PX_2, and PX_3. In an exemplary embodiment, the blue colorant included in the overcoat layer 250 may be approximately several wt % to the total weight of the overcoat layer 250, for example.

A mass ratio of the blue colorant included in the overcoat layer 250 to the entire overcoat layer 250 with respect to one white pixel PX_W is smaller than a mass ratio of the blue colorant included in the blue filter positioned in one blue pixel to the entire blue filter.

The overcoat layer 250 may not include colorants of the color filters 230 included in other color pixels PX_1, PX_2, and PX_3 other than the blue colorant.

Accordingly, in the white pixel PX_W, a color coordinate of the light passing through the overcoat layer 250 may be changed and transmitted according to the blue colorant included in the overcoat layer 250, but the color of the transmitted light may be almost maintained. That is, when white light is incident to a transparent layer 230, the white light is emitted on the whole, and when green light is incident to the transparent layer 230, the green light may be emitted on the whole. However, the color coordinate of the transmitted light may be changed in a predetermined range according to an amount of the blue colorant included in the overcoat layer 250.

Such a characteristic of the overcoat layer 250 will be described below in detail.

A common electrode 270 may be positioned on the overcoat layer 250. In an exemplary embodiment, the common electrode 270 may include a transparent conductive material such as indium tin oxide ("ITO") and indium zinc oxide ("IZO"), and transfer a common voltage. In another exemplary embodiment, the common electrode 270 may also be positioned on the lower panel 100.

A spacer 330 may be positioned on the common electrode 270. In an exemplary embodiment, the spacer 330 may be positioned at a portion overlapping with the light blocking member 220, but is not limited thereto. The spacer 330 may serve to maintain of the cell gap of the liquid crystal layer 3, that is, a space between the upper panel 200 and the lower panel 100.

In an exemplary embodiment, the spacer 330 may include a transparent organic material such as acryl-based resin or may include an opaque organic material.

The liquid crystal layer 3 includes liquid crystal molecules (not illustrated). The liquid crystal layer 3 may have positive dielectric anisotropy or negative dielectric anisotropy. The liquid crystal molecules of the liquid crystal layer 3 may be aligned so that long axes thereof are substantially horizontal or vertical to surface of the lower panel 100 or the upper panel 200 while the electric field is not applied in liquid crystal layer 3. To this end, an alignment layer may be disposed on an inner surface of the lower panel 100 and the upper panel 200. In an exemplary embodiment, the alignment layer may be provided by a method such as physical treatment such as rubbing, optical treatment such as light irradiation, or a chemical treatment after coating an aligning agent on the inner surface of the panel. In an exemplary embodiment, the alignment layer or the liquid crystal layer 3 may include an alignment assisting means such as a polymer for aligning the liquid crystal molecules or giving a pretilt. In an exemplary embodiment, the alignment assisting means may be provided by an optical or chemical method.

Both the pixel electrode and the common electrode 270 of the lower panel 100 may generate the electric field in the liquid crystal layer 3. When the voltages are applied to the pixel electrode and the common electrode 270, the electric field is generated in the liquid crystal layer 3, and the liquid crystal molecules are rearranged. The rearrangement degree of the liquid crystal molecules may be controlled by controlling the intensity of the electric field generated in the liquid crystal layer 3, and as a result, a change degree of polarization of light passing through the liquid crystal layer 3 may be controlled. Then, the light passing through the liquid crystal layer 3 may control transmittance through a polarizer and the like to display an image.

Like the exemplary embodiment of the invention, characteristics of the color coordinate of the display device according to the exemplary embodiment of the invention in which the overcoat layer 250 includes a small amount of the blue colorant in addition to the transparent organic material will be described with reference to FIGS. 5 to 8.

Figure 6:
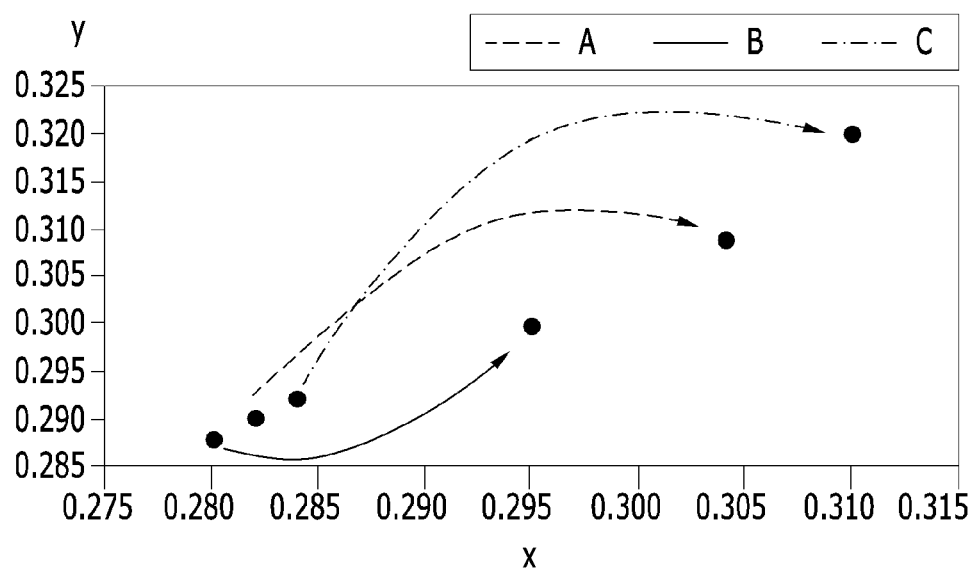
FIG. 6 is a graph illustrating changes in the white color coordinate at a front side and a lateral side of images which are displayed by a plurality of color pixels and a white pixel according to a kind of overcoat layer.
Figure 7:
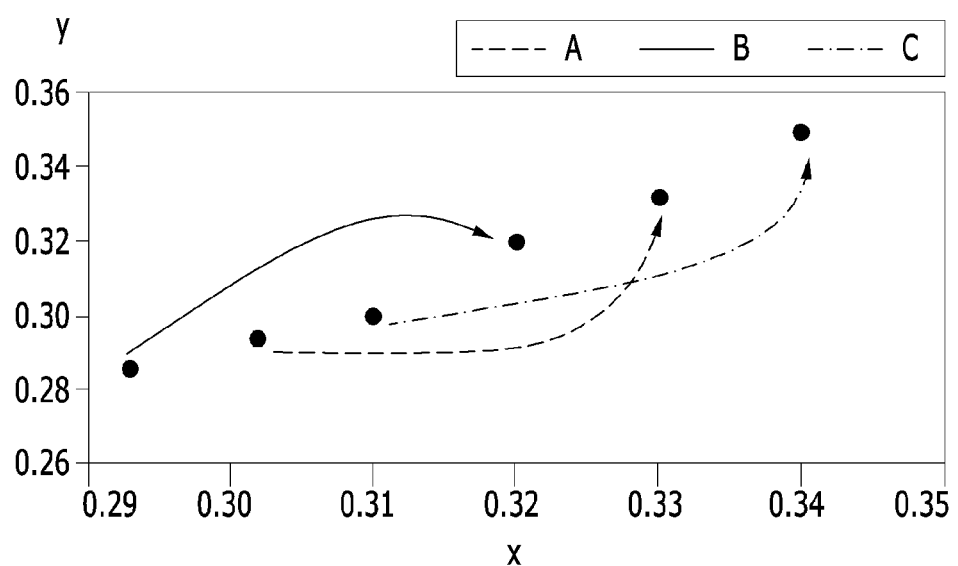
FIG. 7 is a graph illustrating changes in the white color coordinate at a front side and a lateral side of images which are displayed by a white pixel according to a kind of overcoat layer.

FIG. 5 is a table illustrating a white color coordinate at a front side and a lateral side according to a kind of overcoat layer, FIG. 6 is a graph illustrating changes in the white color coordinate at a front side and a lateral side of images which are displayed by a plurality of color pixels and a white pixel according to a kind of overcoat layer, and FIG. 7 is a graph illustrating changes in the white color coordinate at a front side and a lateral side of images which are displayed by a white pixel according to a kind of overcoat layer.

Referring to FIG. 5, a case where an overcoat layer is a transparent organic layer including a blue colorant corresponds to the overcoat layer 250 according to the exemplary embodiment of the invention, and a case where the overcoat layer is a transparent organic layer or a transparent organic layer including red/green colorants corresponds to a Comparative Example for comparison with the exemplary embodiment of the invention. The transparent organic layer including a red/green colorant means a transparent organic layer including a red colorant or a green colorant.

Further, in FIG. 5, an RGB white color coordinate W_RGB represents a color coordinate of white displayed together when the plurality of color pixels PX_1, PX_2, and PX_3 included in the display device is turned on, a white pixel white color coordinate W_W represents a color coordinate of white displayed when only the white pixel PX_W is turned on, and an entire white color coordinate W_all represents a color coordinate of white displayed when the color pixels PX_1, PX_2, and PX_3 and the white pixel PX_W are turned on together. In the case of displaying an image with high luminance, the color pixels PX_1, PX_2, and PX_3 and the white pixel PX_W are turned on together, and in this case, the color coordinate of the observed white becomes the entire white color coordinate W_all.

Here, as the color coordinate, an example which has an x coordinate and a y coordinate on the 1931 CIE XYZ color coordinate system will be described.

In the case (A) of using a general transparent organic layer including a transparent organic material instead of the overcoat layer 250 according to the exemplary embodiment of the invention, experimental data will be first described. Referring to FIG. 5, the RGB white color coordinate W_RGB is (0.268, 0.287) at the front side and (0.28, 0.292) at the lateral side, white pixel white color coordinate W_W is (0.302, 0.294) at the front side and (0.33, 0.332) at the lateral side, and the entire white color coordinate W_all is (0.282, 0.29) at the front side and (0.304, 0.309) at the lateral side. Based on this, in the case (A) of using the general transparent organic layer, it can be seen that a difference between the RGB white color coordinate W_RGB and the white pixel white color coordinate W_W or the entire white color coordinate W_all is significantly large.

Further, referring to FIG. 7, in the case (A) of using the transparent organic layer, it can be seen that a difference between the white pixel white color coordinate W_W viewed from the front side and the white pixel white color coordinate W_W viewed from the lateral side is large, and the white color coordinate W_W viewed from the lateral side largely moves to a region representing yellow and thus white viewed from the lateral side is significantly yellowish. Accordingly, as illustrated in FIG. 6, a difference between the entire white color coordinates W_all at the front side and the lateral side is relatively increased.

In the white pixel PX_W, the overcoat layer 250 or the transparent organic layer instead of the overcoat layer 250 is less planarized, and as a result, when the cell gap of the liquid crystal layer 3 in the white pixel PX_W is larger than the cell gap of the liquid crystal layer 3 in other color pixels PX_1, PX_2, and PX_3, the yellowish phenomenon at the lateral side may be increased.

Next, like the overcoat layer 250 according to the exemplary embodiment of the invention, in the case (B) of including a predetermined amount of the blue colorant, experimental data will be described. Referring to FIG. 5, the RGB white color coordinate W_RGB is (0.268, 0.286) at the front side and (0.28, 0.291) at the lateral side, the white pixel white color coordinate W_W is (0.293, 0.286) at the front side and (0.32, 0.32) at the lateral side, and the entire white color coordinate W_all is (0.28, 0.288) at the front side and (0.295, 0.3) at the lateral side. Based on this, as compared with the case (A) of using the general transparent organic layer, it can be seen that a difference between the RGB white color coordinate W_RGB and the white pixel white color coordinate W_W or the entire white color coordinate W_all is significantly small, and the color coordinates close to each other.

Referring to FIG. 7, in the case (B) of the display device including the overcoat layer 250 according to the exemplary embodiment of the invention, as compared with the case (A) of using the transparent organic layer, it can be seen that a difference between the white pixel white color coordinate W_W viewed from the front side and the white pixel white color coordinate W_W viewed from the lateral side is small and thus the degree that white viewed from the lateral side is yellowish is reduced. Accordingly, as illustrated in FIG. 6, in the case (B) of the display device including the overcoat layer 250 according to the exemplary embodiment of the invention, as compared with the case (A) of using the transparent organic layer, a difference between the entire white color coordinates W_all at the front side and the lateral side is relatively small and a color shift to the yellow region of the color coordinate is decreased.

In comparison with the exemplary embodiment of the invention, in the case (C) where the overcoat layer 250 includes a red colorant and/or a green colorant instead of the blue colorant, experimental data will be described as a Comparative Example. FIGS. 5 to 7 illustrate an Experimental Example where the overcoat layer 250 includes the red colorant and the green colorant as an example. First, referring to FIG. 5, the RGB white color coordinate W_RGB is (0.268, 0.288) at the front side and (0.28, 0.292) at the lateral side, the white pixel white color coordinate W_W is (0.31, 0.3) at the front side and (0.34, 0.35) at the lateral side, and the entire white color coordinate W_all is (0.284, 0.292) at the front side and (0.31, 0.32) at the lateral side. Based on this, in the case where the overcoat layer 250 includes the red colorant and the green colorant instead of the blue colorant, even as compared with the case (A) of using the general transparent organic layer, it can be seen that a difference between the RGB white color coordinate W_RGB and the white pixel white color coordinate W_W or the entire white color coordinate W_all is significantly increased.

Further, referring to FIG. 7, in the case (C) where the overcoat layer 250 includes the red colorant and the green colorant, it can be seen that even as compared with the case (A) of using the transparent organic layer a difference between the white pixel white color coordinate W_W viewed from the front side and the white pixel white color coordinate W_W viewed from the lateral side is large, and the white pixel white color coordinate W_W viewed from the lateral side further moves to the region representing yellow and thus the white viewed from the lateral side is significantly yellowish. Accordingly, as illustrated in FIG. 6, it can be seen that the difference between the entire white color coordinates W_all at the front side and the lateral side is relatively increased and thus the white viewed from the lateral side is more yellowish than the case (A) of using the transparent organic layer.

Figure 8:
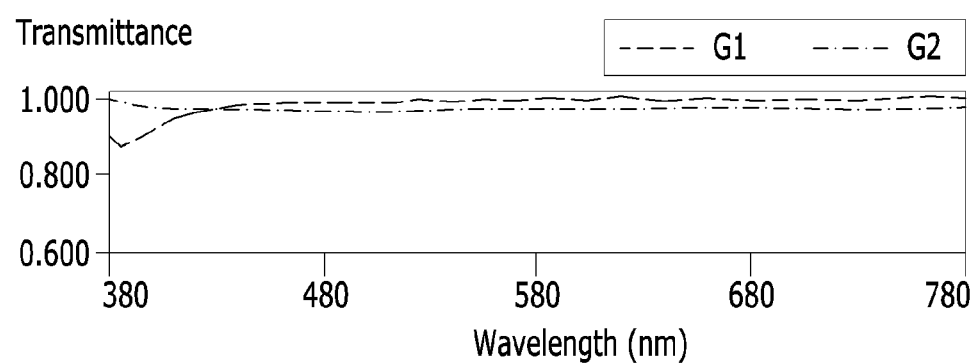
FIG. 8 is a graph illustrating an exemplary embodiment of a transmittance property of an overcoat layer included in the display device according to the invention and a graph illustrating a transmittance property of a transparent organic layer in the related art.

FIG. 8 illustrates a graph G1 illustrating a transmittance property of a transparent organic layer in the related art and a graph G2 illustrating a transmittance property of an overcoat layer 250 included in the display device according to an exemplary embodiment of the invention.

Referring to the graph G1 of FIG. 8, transmittance of light passing through the general transparent organic layer without the blue colorant tends to be decreased in a partial wavelength range, for example, a wavelength range near approximately 380 nm. However, referring to the graph G2 of FIG. 8, it can be seen that transmittance of light passing through the overcoat layer 250 positioned in the white pixel PX_W of the display device according to the exemplary embodiment of the invention is almost constant regardless of the wavelength range. Accordingly, the degree that the color coordinate of the light passing through the white pixel PX_W of the display device according to the exemplary embodiment of the invention is distorted may be decreased.

Like the experimental result, in the display device including the white pixel PX_W, the overcoat layer 250 includes a predetermined amount of the blue colorant, and as a result, a difference between the white color coordinate represented by the color pixels PX_1, PX_2, and PX_3 and the white color coordinate represented by the white pixel PX_W is reduced, thereby enhancing color quality of the displayed image. Further, the difference between the white color coordinate at the front side and the white color coordinate at the lateral side is reduced and thus a color change according to a viewing angle of the display device may be reduced, thereby improving side visibility.

Further, according to the exemplary embodiment of the invention, since a separate white filter positioned only in the white pixel PX_W needs not to be provided, a photomask for forming a separate white filter is not required. Therefore, it is possible to reduce a manufacturing time, manufacturing costs, and the like by simplifying the manufacturing process of the display device.

Next, a display device according to an exemplary embodiment of the invention will be described with reference to FIG. 9 in addition to the drawings described above.

Figure 9:
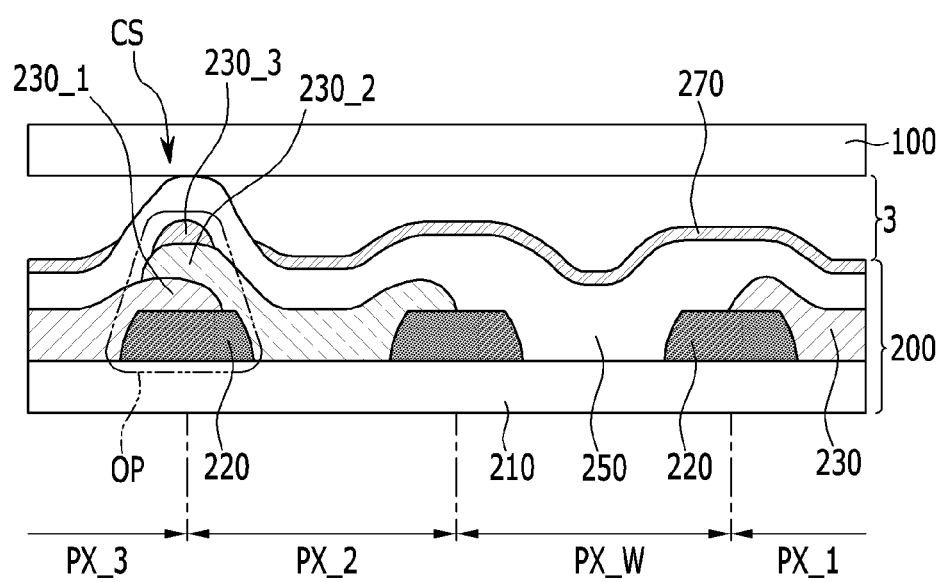
FIG. 9 is a cross-sectional view of the display device illustrated in FIG. 3 taken along line IV-IV.

FIG. 9 is a cross-sectional view of the display device of FIG. 3 taken along line IV-IV.

Referring to FIG. 9, the display device according to the exemplary embodiment is similar to the exemplary embodiment illustrated in FIG. 4 described above, but the light blocking member 220 and at least two of the plurality of color filters 230 overlap with each other to form an overlapping portion OP. The overlapping portion OP may be positioned at a place which overlaps with the light blocking member 220, the TFT, and the signal lines such as the gate line and the data line, but is not limited thereto. FIG. 9 illustrates an example in which three color filters 230 having different colors overlap with each other on the light blocking member 220 to form the overlapping portion OP. The overlapping portion OP may include the light blocking member 220, the first color filter 230_1 thereon, the second color filter 230_2 thereon, and the third color filter 230_3 thereon. In another exemplary embodiment, unlike FIG. 9, the overlapping portion OP may not include the light blocking member 220.

The first to third color filters 230_1, 230_2, and 230_3 overlapping with each other to form the overlapping portion OP may be connected with or spaced apart from the color filters 230 of the adjacent color pixels PX_1, PX_2, and PX_3, as illustrated in FIG. 9.

In an exemplary embodiment, at the overlapping portion OP, a thickness of the first color filter 230_1 positioned on the light blocking member 220 may be smaller than a thickness of the color filters 230 positioned in the transmitting areas of the color pixels PX_1, PX_2, and PX_3 and may be approximately 30% to approximately 70%, for example.

At the overlapping portion OP, a thickness of the second color filter 2302 positioned on the first color filter 230_1 may be smaller than the thickness of the color filters 230 positioned in the transmitting areas of the color pixels PX_1, PX_2, and PX_3 and the thickness of the first color filter 230_1. In an exemplary embodiment, a thickness of the n-th color filter 230_$n$ may be smaller than a thickness of an n−1-th color filter 230_$n-1$ below the n-th color filter 230_$n$, and for example, may be about 30% to about 70% of the thickness of the n−1-th color filter 230_$n-1$, for example.

An overcoat layer 250 is entirely disposed on the color filters 230 and the substrate 210. Since the description of the overcoat layer 250 is the same as described above, here, the detailed description is omitted.

Both the overlapping portion OP and the overcoat layer 250 thereon may serve as a spacer CS for maintaining a cell gap of the liquid crystal layer 3. The common electrode 270 may be removed on the spacer CS.

Next, a display device according to an exemplary embodiment of the invention will be described with reference to FIGS. 10 to 14 in addition to the drawings described above.

Figure 10:
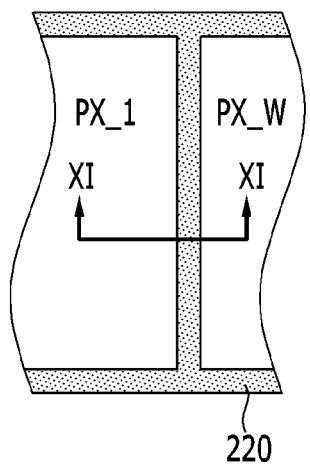
FIG. 10 is a schematic plan view of another exemplary embodiment of a display device according to the invention.

FIG. 10 is a schematic plan view of a display device according to yet another exemplary embodiment of the invention, and FIGS. 11, 12, 13, and 14 are cross-sectional views of the display device illustrated in FIG. 10 taken along line XI-XI, respectively.

Figure 11:
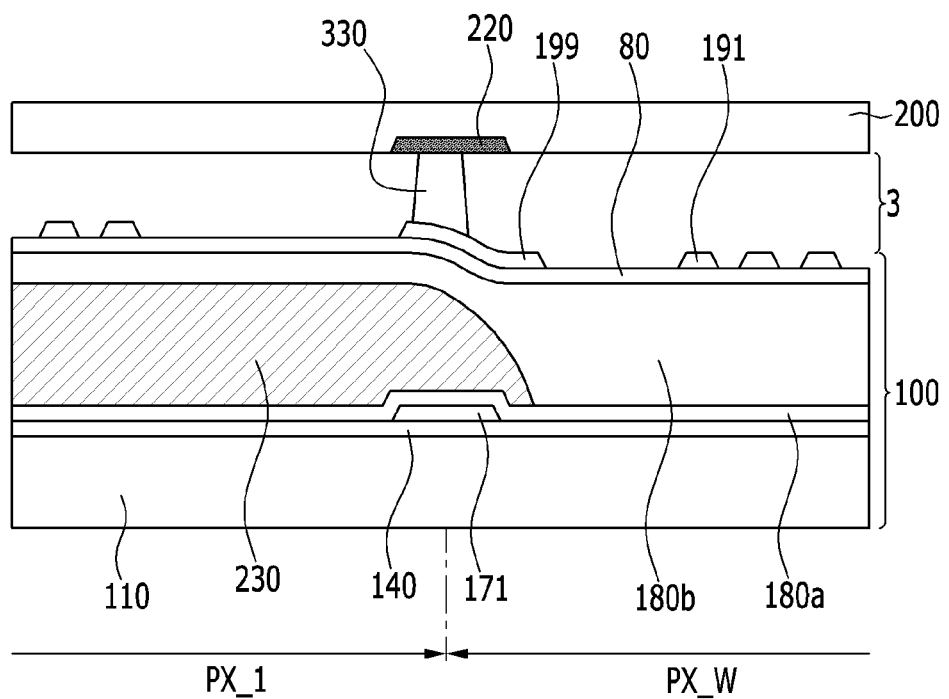
FIGS. 11, 12, 13, and 14 are cross-sectional views of the display device illustrated in FIG. 10 taken along line XI-XI, respectively.

Referring to FIGS. 10 and 11, a display device according to the exemplary embodiment of the invention includes a lower panel 100 and an upper panel 200 facing each other, and a liquid crystal layer 3 interposed between the two panels 100 and 200.

The lower panel 100 includes a substrate 110, and a gate conductor (not illustrated) including a gate line may be positioned on the substrate 110.

A gate insulating layer 140 is positioned on the gate conductor. The gate insulating layer 140 may include an organic insulating material such as silicon nitride and silicon oxide.

A semiconductor layer (not illustrated) and a data conductor are positioned on the gate insulating layer 140. The data conductor includes a plurality of data lines 171 transferring data voltages. The data lines 171 may be almost extended between the adjacent pixels PX_1, PX_2, PX_3, and PX_W, but are not limited thereto.

The TFT is connected with the gate line and the data line 171.

A passivation layer 180a is positioned on the TFT including the data conductor. The passivation layer 180a may include an inorganic insulating material or an organic insulating material.

A plurality of color filters 230 may be positioned on the passivation layer 180a. A color filter representing the corresponding color is positioned one of the color pixels PX_1, PX_2, and PX_3.

An overcoat layer 180b is positioned on the color filter 230 and the passivation layer 180a. The overcoat layer 180b may include a portion positioned in the white pixel PX_W and a portion positioned on the color filters 230 of different color pixels PX_1, PX_2, and PX_3.

The transmitting area of the white pixel PX_W may be almost occupied by the overcoat layer 180b. Accordingly, the thickness of the overcoat layer 180b positioned in the transmitting area of the white pixel PX_W may be substantially the same as or larger than the thickness of the color filters 230 positioned in the transmitting areas of the color pixels PX_1, PX_2, and PX_3. Further, the thickness of the overcoat layer 180b positioned in the transmitting area of the white pixel PX_W may be larger than that of the overcoat layer 180b positioned on the color filters 230 of the color pixels PX_1, PX_2, and PX_3. Accordingly, in the white pixel PX_W, the height of the upper surface of the overcoat layer 180b may be substantially the same as or larger than the height of the upper surface of the color filters 230 positioned in the transmitting areas of the color pixels PX_1, PX_2, and PX_3.

A height of the upper surface of the overcoat layer 180b in the transmitting area of the white pixel PX_W may be smaller than a height of the upper surface of the overcoat layer 180b in the transmitting areas or the light blocking areas of the color pixels PX_1, PX_2, and PX_3, and a difference in height may vary according to the viscosity of the overcoat layer 180b.

In addition, the overcoat layer 180b may have the same feature as the overcoat layer 250 according to the exemplary embodiment described above and effects thereof.

A capping layer 80 may be positioned on the overcoat layer 180b. The capping layer 80 may includes an inorganic insulating material, and may be omitted. According to another exemplary embodiment of the invention, the capping layer 80 may be positioned between the color filter 230 and the overcoat layer 180b.

A plurality of pixel electrodes 191 and shielding electrodes 199 may be positioned on the capping layer 80. The pixel electrode 191 and the shielding electrode 199 may include a transparent conductive material such as ITO or IZO.

The pixel electrode 191 is patterned to have a shape including a plurality of branch electrodes (not illustrated), but is not limited thereto. The pixel electrode 191 is connected with the TFT through a contact hole (not illustrated) defined in at least a part of the capping layer 80, the overcoat layer 180b, and the passivation layer 180a to receive a data voltage.

The shielding electrode 199 may include a portion that covers the data line 171. The shielding electrode 199 shields an electric field from the data line 171 to prevent light leakage between the adjacent pixels. Accordingly, a separate light blocking member overlapping with the data line 171 needs not to be provided, thereby increasing an aperture ratio and transmittance of the pixels.

The upper panel 200 may include a light blocking member 220. Unlike this, the light blocking member 220 may be positioned on the lower panel 100.

The lower panel 100 may include a spacer 330 positioned on the shielding electrode 199. The spacer 330 may be positioned at a portion overlapping with the light blocking member 220, but is not limited thereto. The spacer 330 may serve to maintain the cell gap of the liquid crystal layer 3, that is, a space between the upper panel 200 and the lower panel 100.

In addition, many features of the exemplary embodiment described above may be equally applied to the exemplary embodiment.

Figure 12:
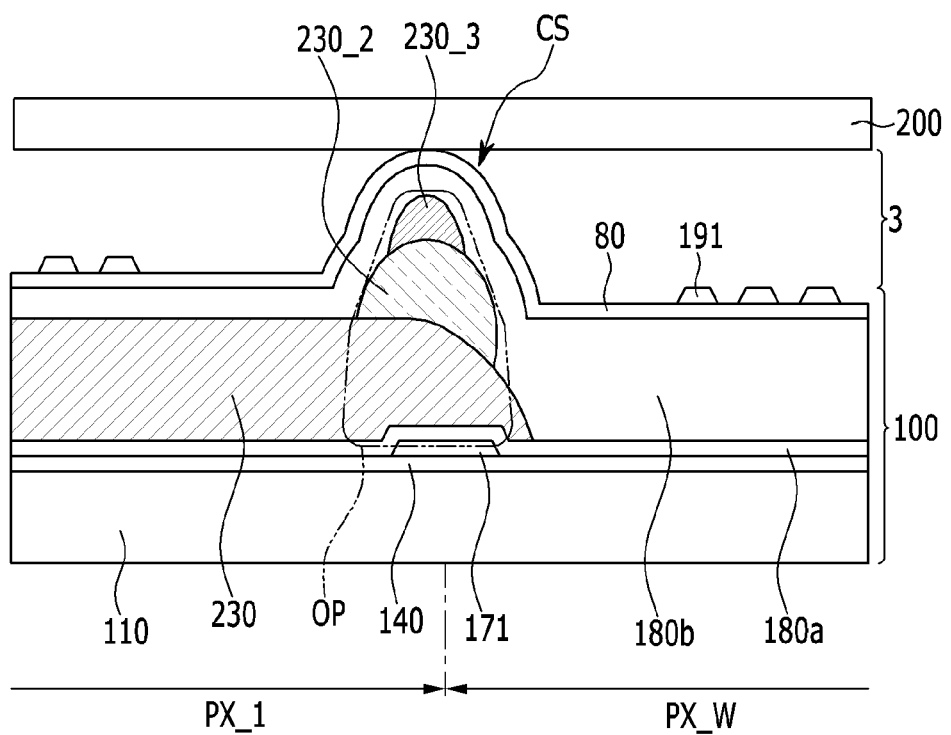

Next, referring to FIG. 12, the display device according to the exemplary embodiment is similar to that of the exemplary embodiment illustrated in FIG. 11 described above, but three color filters 230 having different colors overlap with each other to form an overlapping portion OP. That is, the overlapping portion OP may include a first color filter 230_1, a second color filter 230_2 thereon, and a third color filter 230_3 thereon. Both the overlapping portion OP and the overcoat layer 180b thereon may form a spacer CS for maintaining a cell gap of the liquid crystal layer 3.

Figure 13:
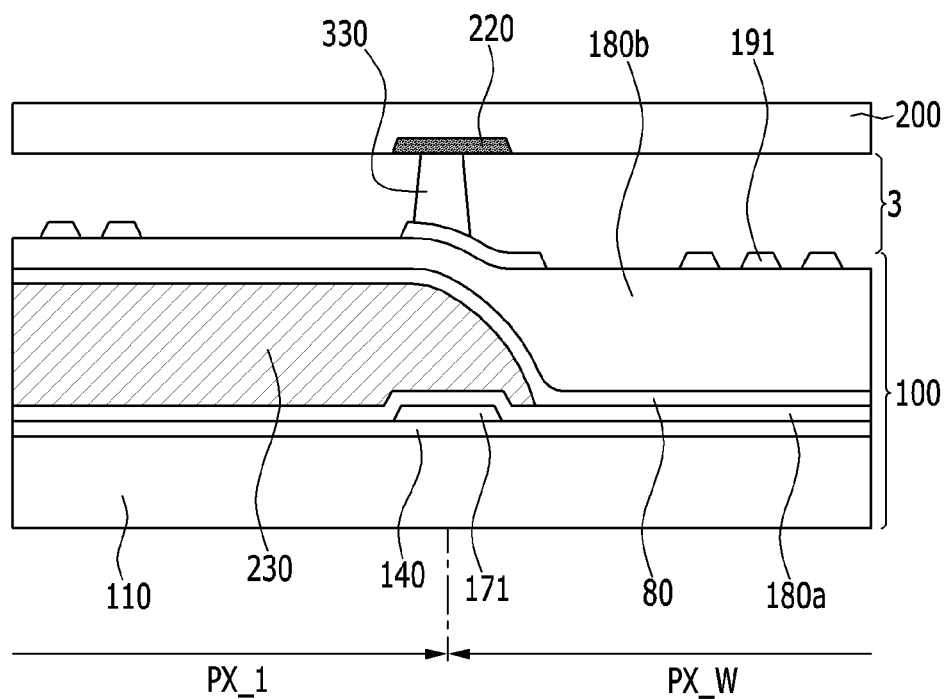

Next, referring to FIG. 13, the display device according to the exemplary embodiment is similar to that of the exemplary embodiment illustrated in FIG. 11 described above, but positions of the capping layers 80 may be different from each other. The capping layer 80 may be positioned below the overcoat layer 180b and positioned on the color filters 230 and the passivation layer 180a. As a result, the plurality of pixel electrodes 191 and shielding electrodes 199 may be positioned directly on the overcoat layer 180b.

Figure 14:
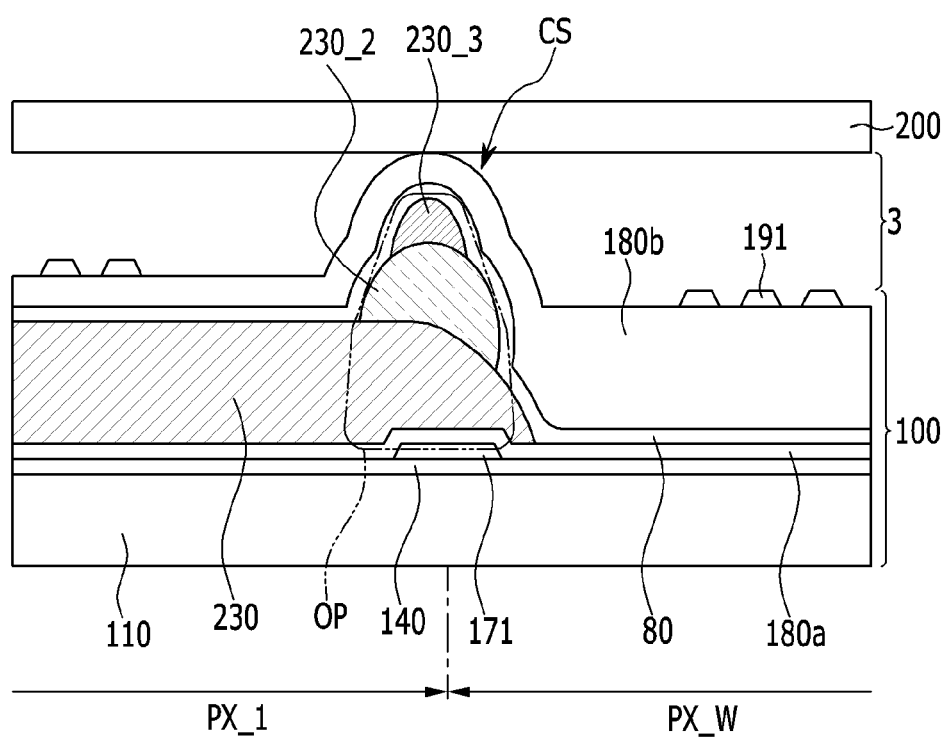

Next, referring to FIG. 14, the display device according to the exemplary embodiment is similar to that of the exemplary embodiment illustrated in FIG. 12, but the capping layer 80 is positioned below the overcoat layer 180b and positioned on the color filters 230 and the passivation layer 180a.

Many feature and effects thereof of the exemplary embodiment described above may be applied to the exemplary embodiment.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
a plurality of color filters positioned in a plurality of color pixels, respectively, and representing different colors from each other; and
an overcoat layer including a transparent organic material and a blue colorant, the overcoat layer including a portion positioned on the plurality of color filters and a portion positioned in a white pixel.

2. The display device of claim 1, wherein:
the plurality of color filters includes a red filter representing red, a green filter representing green, and a blue filter representing blue, and
an amount of the blue colorant included in the overcoat layer positioned in one of the white pixel is smaller than an amount of a blue colorant included in the blue filter positioned in one of the plurality of color pixels.

3. The display device of claim 2, further comprising:
a first substrate and a second substrate facing each other; and
a plurality of signal lines positioned on the first substrate,
wherein each of the plurality of color pixels and the white pixel includes at least one thin film transistor connected with the plurality of signal lines, and
the plurality of color filters and the overcoat layer are positioned on the second substrate.

4. The display device of claim 3, further comprising:
a light blocking member which is positioned on the second substrate and in which a plurality of openings is defined,
wherein the plurality of color filters includes a portion positioned in the plurality of openings of the light blocking member, and
the overcoat layer includes a portion positioned in the white pixel and positioned in the plurality of openings of the light blocking member.

5. The display device of claim 4, wherein:
a thickness of the overcoat layer positioned in the white pixel is larger than a thickness of the overcoat layer positioned in the plurality of color pixels.

6. The display device of claim 5, wherein:
a height of an upper surface of the overcoat layer positioned in the white pixel is smaller than a height of the upper surface of the overcoat layer positioned in the plurality of color pixels.

7. The display device of claim 2, further comprising:
a substrate and a plurality of signal lines positioned on the substrate,
wherein each of the plurality of color pixels and the white pixel includes at least one thin film transistor connected with the plurality of signal lines, and
the plurality of color filters and the overcoat layer are positioned on the at least one thin film transistor.

8. The display device of claim 7, wherein:
a thickness of the overcoat layer positioned in the white pixel is larger than a thickness of the overcoat layer positioned in the plurality of color pixels.

9. The display device of claim 8, wherein:
a height of an upper surface of the overcoat layer positioned in the white pixel is smaller than a height of the upper surface of the overcoat layer positioned in the plurality of color pixels.

10. The display device of claim 9, further comprising:
a plurality of pixel electrodes positioned on the overcoat layer.

11. The display device of claim 1, further comprising:
a first substrate and a second substrate facing each other; and
a plurality of signal lines positioned on the first substrate,
wherein each of the plurality of color pixels and the white pixel includes at least one thin film transistor connected with the plurality of signal lines, and
the plurality of color filters and the overcoat layer are positioned on the second substrate.

12. The display device of claim 11, further comprising:
a light blocking member which is positioned on the second substrate and in which a plurality of openings is defined,
wherein the plurality of color filters includes a portion positioned in the plurality of openings of the light blocking member, and
the overcoat layer includes a portion positioned in the white pixel and positioned in the plurality of openings of the light blocking member.

13. The display device of claim 12, wherein:
a thickness of the overcoat layer positioned in the white pixel is larger than a thickness of the overcoat layer positioned in the plurality of color pixels.

14. The display device of claim 13, wherein:
a height of an upper surface of the overcoat layer positioned in the white pixel is smaller than a height of the upper surface of the overcoat layer positioned in the plurality of color pixels.

15. The display device of claim 1, further comprising:
a substrate and a plurality of signal lines positioned on the substrate,
wherein each of the plurality of color pixels and the white pixel includes at least one thin film transistor connected with the plurality of signal lines, and
the plurality of color filters and the overcoat layer are positioned on the thin film transistor.

16. The display device of claim 15, wherein:
a thickness of the overcoat layer positioned in the white pixel is larger than a thickness of the overcoat layer positioned in the plurality of color pixels.

17. The display device of claim 16, wherein:
a height of the upper surface of the overcoat layer positioned in the white pixel is smaller than a height of the upper surface of the overcoat layer positioned in the plurality of color pixels.

18. The display device of claim 17, further comprising:
a plurality of pixel electrodes positioned on the overcoat layer.

19. The display device of claim 1, wherein:
a thickness of the overcoat layer positioned in the white pixel is larger than a thickness of the overcoat layer positioned in the plurality of color pixels.

20. The display device of claim 1, wherein:
a height of the upper surface of the overcoat layer positioned in the white pixel is smaller than a height of the upper surface of the overcoat layer positioned in the plurality of color pixels.

\* \* \* \* \*